(12) United States Patent
Kim et al.

(10) Patent No.: US 6,992,366 B2
(45) Date of Patent: Jan. 31, 2006

(54) STACKED VARIABLE INDUCTOR

(75) Inventors: Cheon Soo Kim, Daejon-Shi (KR); Pil Jae Park, Daejon-Shi (KR); Mun Yang Park, Daejon-Shi (KR); Hyun Kyu Yu, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 115 days.

(21) Appl. No.: 10/671,637

(22) Filed: Sep. 29, 2003

(65) Prior Publication Data

US 2004/0140528 A1 Jul. 22, 2004

(30) Foreign Application Priority Data

Nov. 13, 2002 (KR) .................. 10-2002-0070287

(51) Int. Cl.
*H01L 29/00* (2006.01)
*H01L 21/20* (2006.01)

(52) U.S. Cl. ................. 257/531; 257/528; 438/381

(58) Field of Classification Search ........... 257/531, 257/528; 330/277; 438/381
See application file for complete search history.

(56) References Cited

U.S. PATENT DOCUMENTS

| 4,841,253 | A | * | 6/1989 | Crabill .................. 330/277 |
| 5,461,353 | A | | 10/1995 | Eberhardt |
| 6,201,287 | B1 | | 3/2001 | Forbes |
| 2002/0064923 | A1 | * | 5/2002 | Yamauchi et al. ........ 438/382 |

FOREIGN PATENT DOCUMENTS

| EP | 0694904 A2 | 1/1996 |
| JP | 7142258 | 6/1995 |
| JP | 8045744 | 2/1996 |
| JP | 8-162331 | 6/1996 |
| KR | 2000-15617 | 3/2000 |

OTHER PUBLICATIONS

Alireza Zolfaghari, et al.; "Stacked Inductors and Transformers in CMOS Technology"; IEEE Journal of Solid-State Circuits; vol. 36, No. 4; Apr. 2001; pp. 620-628.

Chih-Chun Tang, et al.; "Miniature 3-D Inductors in Standard CMOS Process"; IEEE Journal of Solid-State Circuits; vol. 37, No. 4; Apr. 2002; pp. 471-480.

* cited by examiner

*Primary Examiner*—Michael Trinh
*Assistant Examiner*—Kiesha Rose
(74) *Attorney, Agent, or Firm*—Mayer, Brown, Rowe & Maw LLP (57) ABSTRACT

Disclosed is a stacked variable inductors manufactured by stacking M (M≧2) metal layers on a semiconductor substrate, and provides stacked variable inductors comprising, 1 to N inductors continuously connected in serial, wherein each of said inductors is formed on N (N≦M) metal layers that are different each other; first and second ports each connected to the highest positioned inductor and to the lowest positioned inductor among said 1 to N inductors; and at least one MOSFET, and wherein one terminal of at least one MOSFET is connected to one of the first and second ports, and the other one is connected to one of adjacent terminals connected in serial between 1 to N inductors.

9 Claims, 8 Drawing Sheets

STACKED VARIABLE INDUCTOR

BACKGROUND OF THE INVENTION

1. Field of the Invention

The present invention relates to a stacked variable inductor, in particular to the inductor that can have variable inductance by using MOSFETs and inductors formed on two or more than two different layers in a CMOS structure having a plurality of metal layers.

2. Description of the Prior Art

RF blocks of recent RF IC technology has become more complicated to accommodate various services such as 900 MHz cellular, 1.5 GHz GPS, 1.9 GHz PCS, 2.4 GHz Blue-tooth, 5.2 GHz WLAN. This occurs because that a carrier frequency of each service is different so that transmitting/receiving circuit that is to be processed should be changed in accordance with each band of the carrier frequency. The most part that is changing from the transmitting/receiving circuit in accordance with a different carrier frequency is an impedance matching circuit.

An inductance matching circuit usually consists of inductors and capacitors, and an integrated inductor and capacitor are commonly used, but an integrated variable inductor is hardly used. When the integrated variable inductor and capacitor are available, input/output impedance in an amplifying circuit can be matched to several carrier frequencies, and signals of double or multi band can be processed with one amplifier so that transmitting/receiving terminals can be made with ease.

Hereinafter, inductors implemented by the prior art will be explained with reference to the accompanying drawings.

Figure 1:
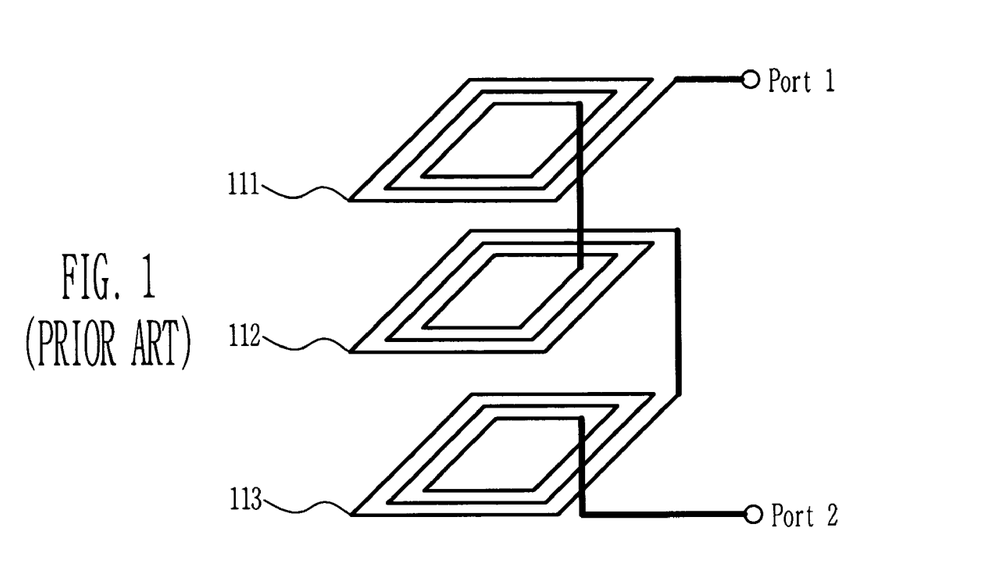
FIG. 1 to 3 show stacked inductors of the prior art.

First of all, a stacked inductor in accordance with the prior art will be explained with reference to FIG. 1. Metal wirings 111, 112, 113 wound in coil form are connected to a port 1 and port 2 so that an inductor is formed. A stacked inductor using such multi layered wiring technology uses a stacked structure by connecting inductors 111, 112, 113 having small area in serial in order to reduce its area while maintaining high inductance.

However, this variable inductor has disadvantage that parasitic capacitance presenting between stacked inductors causes a resonance frequency $f_{res}$ low to be 0.9~1.8 GHz so that the inductor can not be used above the resonance frequency and it's impedance can not be varied.

Figure 2:
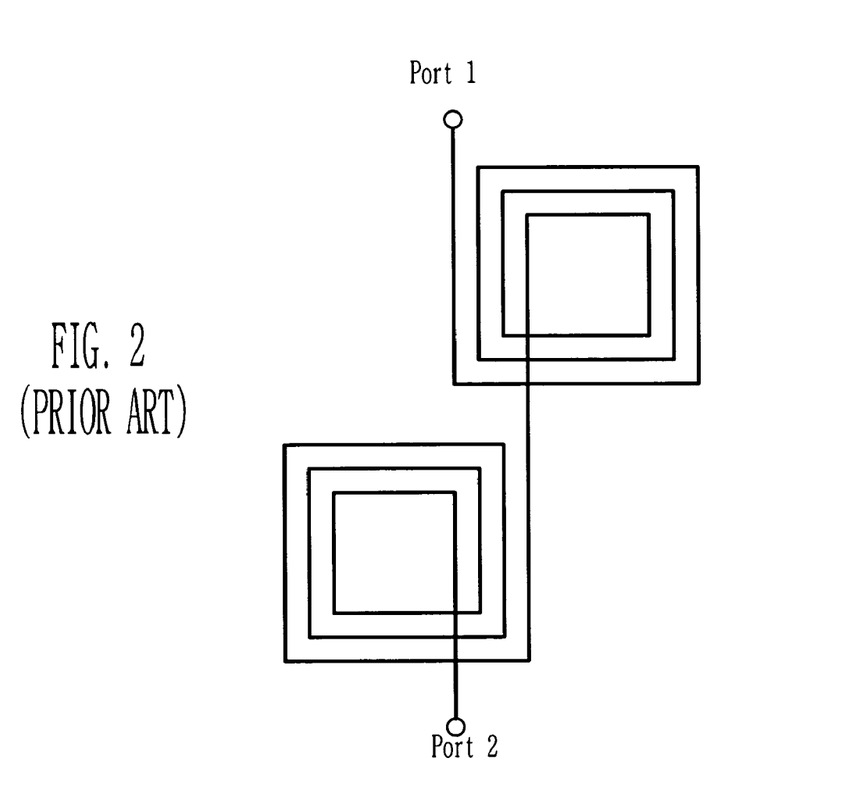

Next, as shown in FIG. 2, an inductor of the prior art includes an inductor for DC bias. This inductor is formed with single layer and occupies large area, so that it's impedance cannot be variably used.

Figure 3:
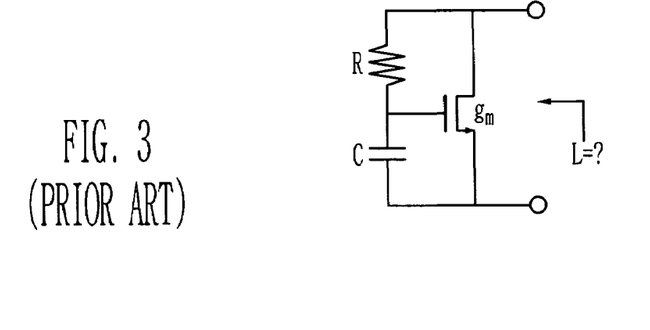

FIG. 3 shows a variable active inductor of the prior art. In the prior art, an active inductor takes the most part of integrated variable inductor technology, which has characteristics that it can vary its inductance by having the equivalent configuration as the inductor shown in FIG. 3. This scheme has an advantage of having high quality factor. However, additional power consumption is required for the inductor and the inductor cannot be applied for frequency above 1~2 GHz.

Therefore, an example of variable inductor using switches and multi metal CMOS technology among disclosed variable inductor up to the present time does not exist.

SUMMARY OF THE INVENTION

Therefore, the object of the present invention is to provide a new kind of stacked variable inductor.

The other object of the present invention is to provide a programmable stacked inductor implementing several variable inductances.

Another object of the present invention is to provide a stacked variable inductor that has reduced chip area of RF IC for double band or multi band when applied to a matching circuit by varying inductance from the stacked inductor and MOSFETs Another object of the present invention is to reduce the area while having equal inductance when compared to the design of flat type inductor.

The present invention provides stacked variable inductors comprising, 1 to N inductors continuously connected in serial, wherein each of said inductors is formed on N (N≦M) metal layers that are different each other; first and second ports each connected to the highest positioned inductor and to the lowest positioned inductor among said 1 to N inductors; and at least one MOSFET, and wherein one terminal of at least one MOSFET is connected to one of the first and second ports, and the other one is connected to one of adjacent terminals connected in serial between 1 to N inductors.

In the meantime, the present invention can be commonly applied to multi wiring process utilized in CMOS technology, and metal layers are stacked by CMOS technology, and preferred switching element is a MOSFET.

In addition, turns of at least two of 1 to N inductors can be made different each other, and inductance of the stacked variable inductors can be varied by ON/OFF of switching elements.

Meanwhile, each of turns of 1 to N inductors can be gradually decreased or increased from the lower position to the upper position of the substrate, so that more effective variable characteristics can be implemented.

Such stacked variable inductors can be applied for multi band including at least two bands among 900 MHz, 1.5 GHz, 1.9 GHz, 2.4 GHz, and 5.2 GHz, and in particular, can operate in an operation frequency not less than 2 GHz.

Hereinafter, embodiments of the present invention will be explained with reference to the accompanying drawings. Although the present invention has been described in conjunction with the preferred embodiment, the present invention is not limited to the embodiments, and it will be apparent to those skilled in the art that the present invention can be modified in variation within the scope of the invention.

DESCRIPTION OF THE PREFERRED EMBODIMENT (First Embodiment)

Figure 4:
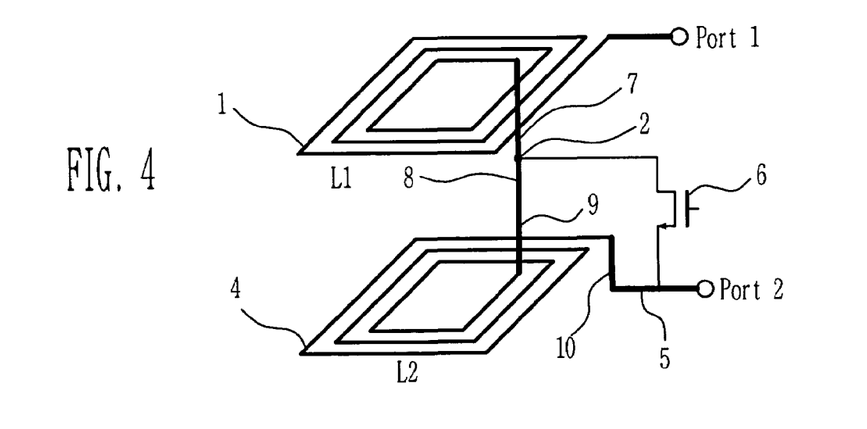
FIG. 4 is a concept view for explaining a stacked variable inductor in accordance with a first embodiment of the present invention.

Hereinafter, the integrated variable inductor in accordance with the first embodiment of the present invention will be explained in detail with reference to FIGS. 4 and 5. FIG. 4 is a concept view for explaining a stacked variable inductor in accordance with a first embodiment of the present invention, and FIG. 5 shows a cross sectional view that is applied to actual substrate by using CMOS technology in accordance with the first embodiment of the present invention.

Referring to FIG. 4, a switching element 6 is connected between stacked upper inductor and lower inductor L1 and L2 using CMOS technology that have different values of inductance when the element is turned on/off, thereby the variable inductor can be implemented as single stacked inductor. One terminal of each of upper and lower inductors L1 and L2 is connected to the port 1 or port 2, and the other one of each of upper and lower inductors L1 and L2 is connected each other by contact electrodes 7, 8, 9. In addition, the switching element 6 is connected to the inductor L2 in parallel.

Figure 5:
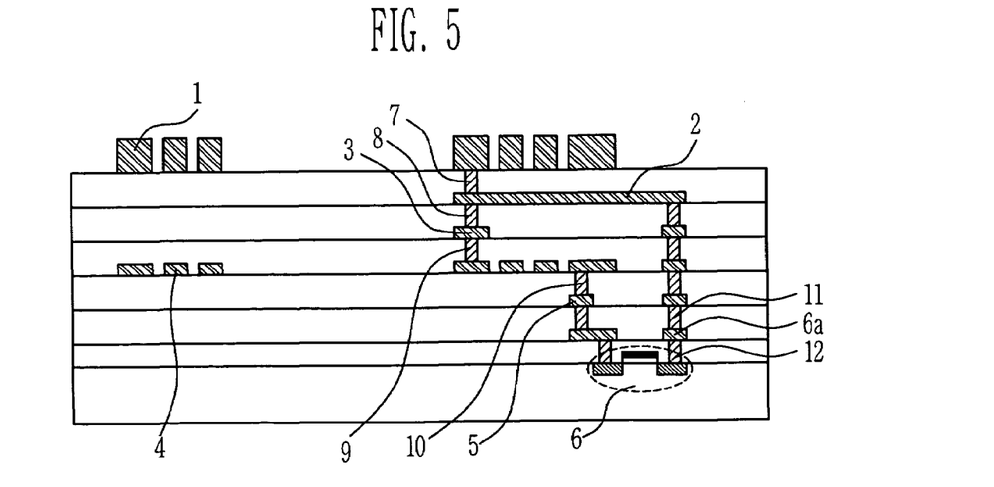
FIG. 5 is a concept view that is applied to actual substrate by using CMOS technology in accordance with the first embodiment of the present invention.

FIG. 5 shows one example of stacked variable inductor formed on an actual substrate. In semiconductor processes such as conventional CMOS process, there exists a stacked variable inductor consisting of insulators and metal layers. In FIG. 5, six metal layers 1 to 6 are formed on different layers, respectively, and the switching element 6 is formed on another different layer. In addition, continuous metal layers are connected each other by contacts 7 to 12. Six metal layers are explained in this embodiment, however, it is understood that the number of metal layers can be changed. Although the switching element 6 is formed on a layer different from the layers on which those metal layers are formed, it is also understood that the metal layer 6A, for example, can be formed as one electrode of the switching element 6.

In this embodiment, the lower inductor L2 is formed on the third metal layer 4 from the substrate, and the upper inductor L1 is formed the sixth metal layer 1 from the substrate. Also, one of those inductors and the switching element 6 are connected in parallel. Various kinds of switching element can be used for the switching element 6 in consideration of different structures such as a sort of used substrate being used, type of device being applied etc, and for example, MOSFET device can be used for the switching element when CMOS process is applied. One terminal of the lower inductor L2 is connected to one of source/drain electrodes of the MOSFET device, and the other one is connected between the upper inductor L1 and the lower inductor L2. In addition, each of metal layers is connected each other by contact electrodes 7 to 12 as shown in FIG. 5. A line width and thickness of each layer such as an insulation layer, metal layer etc can be varied if necessary, and the metal layer, for example, can be formed with several thousand Å in thickness.

Next, the operation of the embodiment will be explained with reference to FIGS. 6A and 6B, which show equivalent circuits of said stacked variable inductor.

Figure 6A:
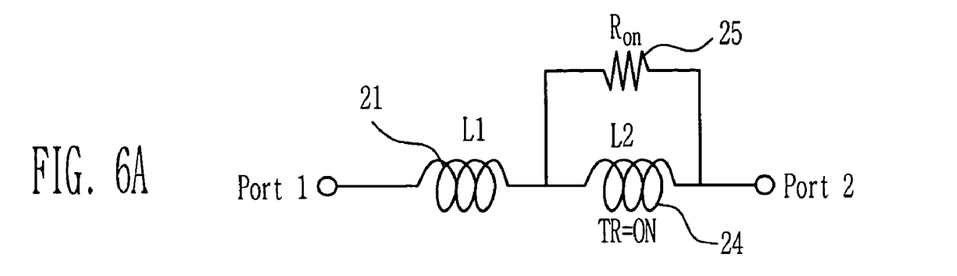
FIGS. 6A and 6B are concept views that show equivalent circuits of the stacked variable inductor in accordance with the first embodiment of the present invention.
Figure 6B:
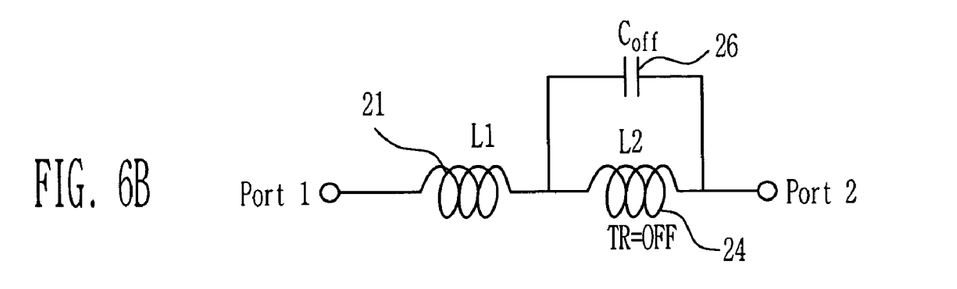

FIG. 6A shows an equivalent circuit when the MOSFET device 6 is turned on, and FIG. 6B shows an equivalent circuit when it is turned off. MOSFET device 6 acts as a resistance $R_{on}$ when it is turned on, and acts as a capacitor $C_{off}$ when it is turned off. Therefore, total inductance varies when MOSFET device 6 is turned on and turned off. When the transistor is in ON state, total inductance has a value of L1 inductance if the transistor is an ideal switch, however $R_{on}$ of the transistor exists, thereby the inductance L2 affects the total inductance to some extent. In addition, it is possible to use random region of the MOSFET device 6 having smaller resistance than that when it is turned off and having higher resistance than that when it is turned on by using direct line region of the MOSFET device 6, if necessary. (In this case, the voltage level of the gate electrode of MOSFET device 5 must be adjusted) However, hereinafter, inductance will be adjusted only by turning on/off the MOSFET device for simplicity of explanation.

Meanwhile, required operation characteristics can be achieved when ON impedance (main component is $R_{on}$) of the MOSFET device 6 turned on is smaller than the impedance of L2 in any usable frequency. If the ON impedance of the MOSFET device 6 is not smaller than the impedance of L2, the required variable inductor characteristics may have a disadvantage. $R_{on}$ resistance of the MOSFET device 6 is relatively high, and if parasitic capacity between source/drain becomes higher than other elements, usage of the MOSFET device as a switch in high frequency region may be limited. However, as the size of the MOSFET device 6 becomes scaled down to 0.18, 0.15, and 0.13 µm, etc, $R_{on}$ resistance is also reduced, so that the element can be applied to high frequency.

When the MOSFET device 6 is turned off, the MOSFET device 6 connected to the inductor L2 in parallel operates as a circuit in which capacitance $C_{off}$ between source and drain electrodes is connected in parallel. In this case, it can be preferable that impedance (main component is $C_{off}$) when the MOSFET device 6 is turned off is much higher than the impedance of the inductor L2 for obtaining required operation characteristics. To achieve this, $C_{off}$ can be minimized by using an element having as small channel as possible.

For the actual application of this embodiment, the number of turns of each inductor, line width and thickness of inductor wirings, resistance, operation frequency, and source/drain capacitance when the switching element is on/off, line width and resistance of metal wirings, resistance of contact electrodes, etc, should be taken into consideration.

When the multi wirings stacked inductor in accordance with the present embodiment is designed to have high inductance with small regions by the CMOS technology, it can obtain high inductance like 40~100 nH by stacking inductors having 5~7 turns in 2 or 3 layer form, and can be implemented in small regions several times as small as a flat structure.

(Second Embodiment)

Figure 7:
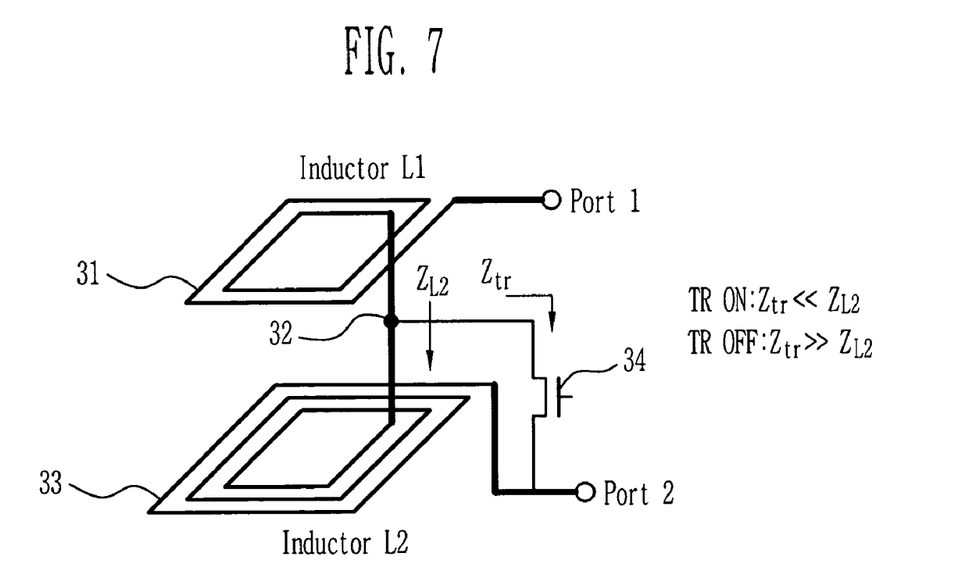
FIG. 7 is a concept view for explaining an integrated variable inductor in accordance with a second embodiment of the present invention.

Hereinafter, an integrated variable inductor in accordance with the second embodiment of the present invention will be explained with reference to FIG. 7. Difference between the first and second embodiments can be described for the number of turns of inductor L1 and L2.

In the second embodiment, the variable inductance range of one inductor can be increased from adjustment of turns of each inductor. Alternatively, when the transistor is turned on, total inductance has an inductance value of L1 if the transistor is an ideal switch. But, there exists a resistance $R_{on}$ of the transistor, so the number of L2 turns can be increased in order to increase the impedance of the inductor L2 higher than impedance of the transistor while the transistor is On state.

(Third Embodiment)

Figure 8:
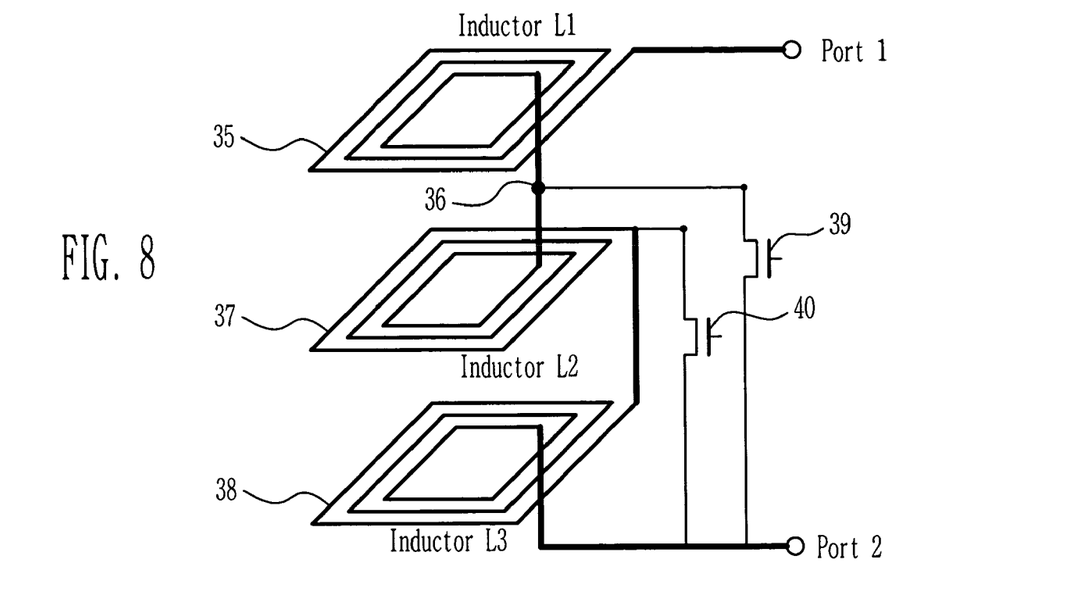
FIG. 8 is a concept view for explaining the stacked variable inductor using three inductors each formed on different layers in accordance with a third embodiment of the present invention.
Figure 9A:
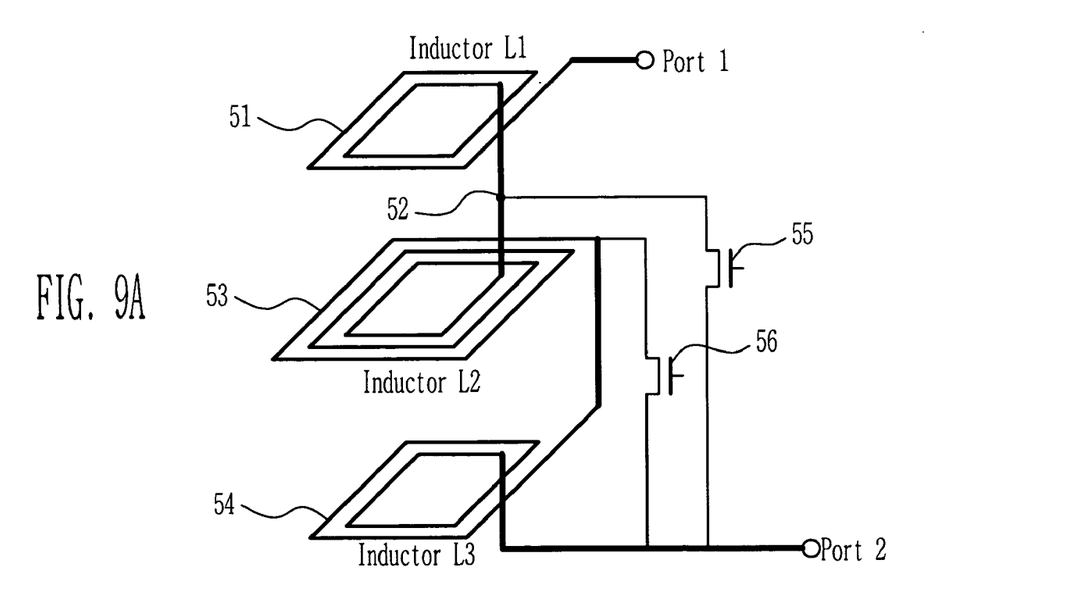
FIG. 9A to 9D shows alternatives of the stacked variable inductor in accordance with the third embodiment of present invention.
Figure 9B:
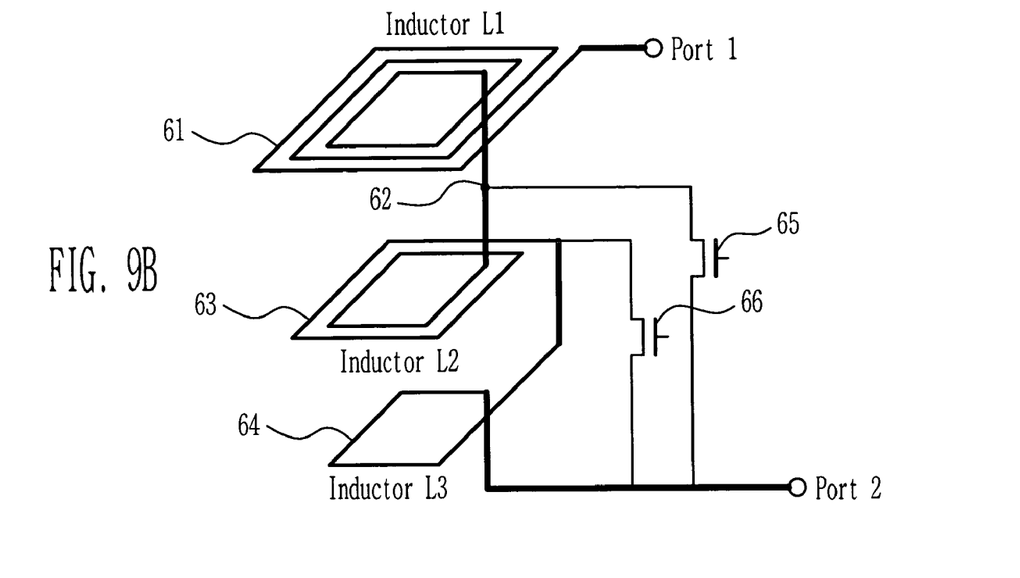
Figure 9C:
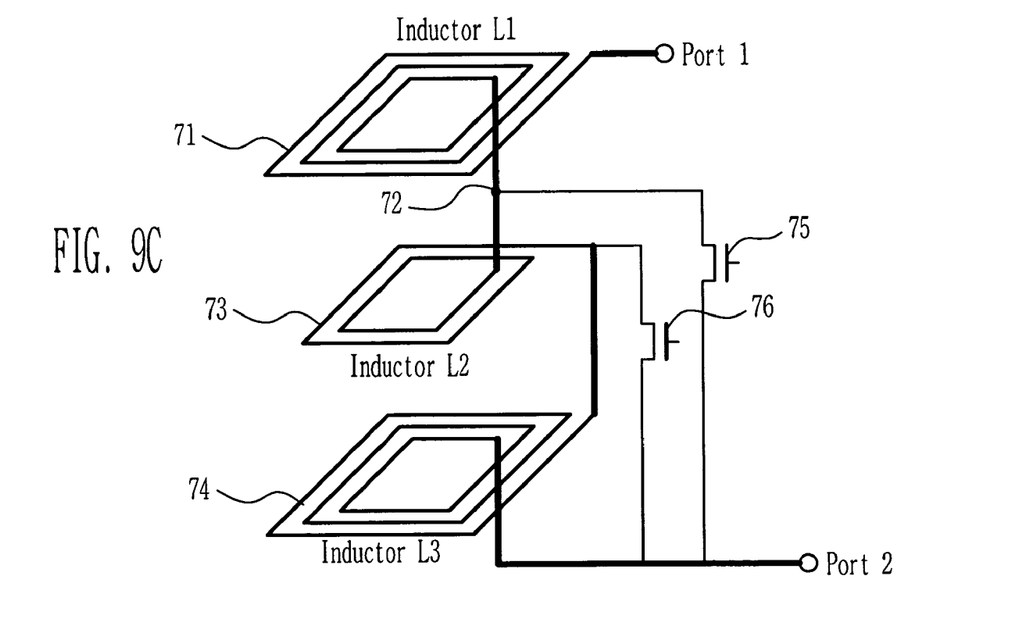
Figure 9D:
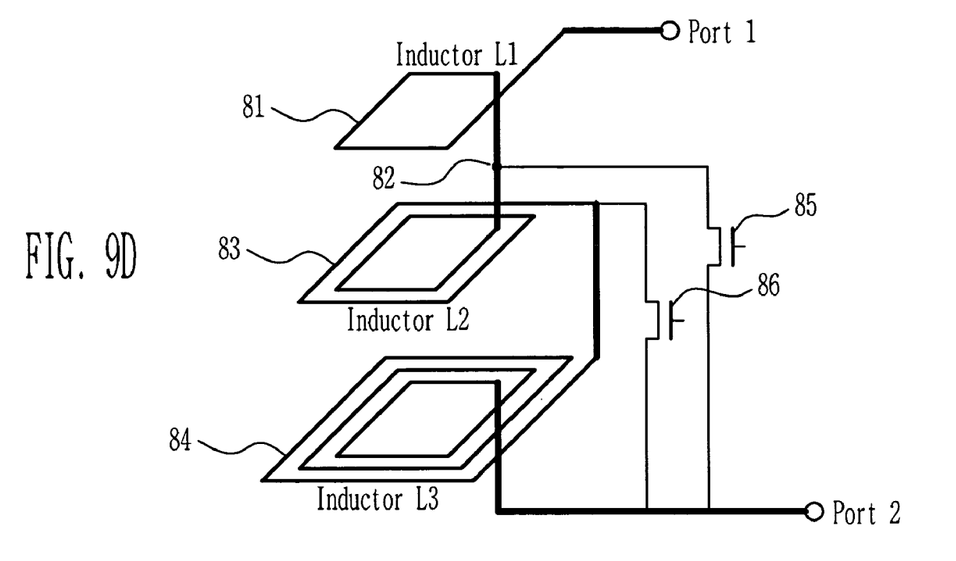

Hereinafter, a stacked variable inductor using three inductors 35, 37, and 38 each formed on a different layer in accordance with the third embodiment of the present invention will be explained with reference to FIG. 8. For example, inductors are formed by metal layers each on sixth, fourth, and second layers, and a first switching element 39 is connected between a terminal 36 and a port 2, and a second switching element 40 is connected between a port 2 and a terminal between the inductor 37 and inductor 38.

In this embodiment, the inductance can be varied to three values in accordance with the ON/OFF states of switches S1 39 and S2 40. It is also understood that $R_{on}$ and $C_{off}$ when the switch is turned on/off should be taken into consideration as is described in the above embodiments.

(Fourth~Seventh Embodiment)

In addition, FIG. 9A to 9D show alternatives of the stacked variable inductor in accordance with the third embodiment of present invention. Each turn of inductors L1, L2, and L3 can be made different. In the fourth embodiment, the number of turns of the inductor L2 (53) can have the biggest value among three inductors L1, L2, and L3 (51, 53, and 54), and the number of the rest two inductors L1 and L2 can have the same values. (See FIG. 9A) In the fifth embodiment, the number of turns of the inductor L1 can have the biggest value among three inductors L1, L2, and L3, and the number of turns of the inductor L2 can have the middle value, and the inductor L3 can have the smallest value in this order. (See FIG. 9B) In the sixth embodiment, the numbers of the inductor L1 and inductor L2 can have the biggest value among three inductors L1, L2, and L3, and the number of turns of the inductor L2 can have the value smaller than that of said two inductors. (See FIG. 9C) In the seventh embodiment, the number of turns of the inductor L3 can have the biggest value among three inductors L1, L2, and L3, and the number of turns of the inductor L2 can have the middle value, and the inductor L1 can have the smallest value in this order. (See FIG. 9D)

Parasitic capacity component or mutual inductance between layers can be reduced by increasing or decreasing the turns of inductor L1, L2, and L3 as shown in FIG. 9 to have the inductor available for up to high frequency.

In the meantime, the number of metal layers that can be commonly disclosed for stacking in CMOS technology is 6 for 0.18 μm process, 7 for 0.15 μm, and 8 for 0.13 μm, and this can be applied to various embodiments of the present invention. However, in the case of 8 metal layers, it is preferable to have the number of turns of each metal layer equal to or less than 3 or 4, and this enables it possible to configure inductances equal to or more than 4 with one inductor.

(Eighth Embodiment)

Figure 10:
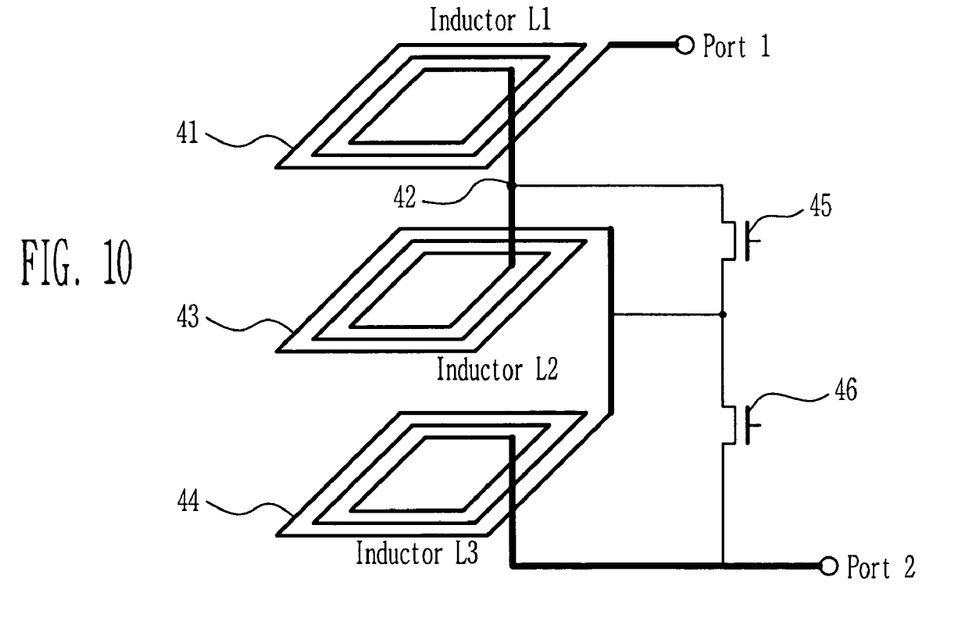
FIG. 10 is a concept view for explaining an integrated variable inductor in accordance with an eight embodiment of the present invention.
Figure 11:
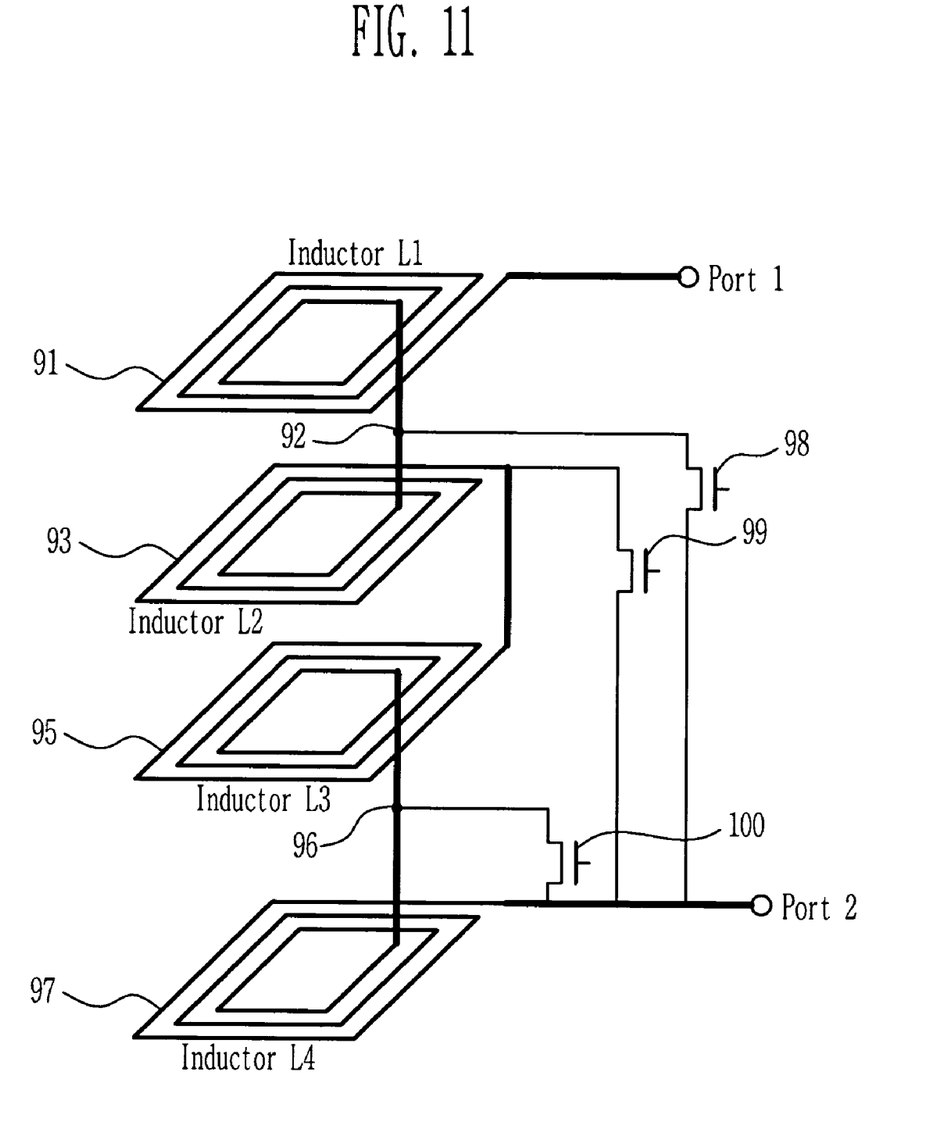
FIGS. 11 and 12 are concept views for explaining stacked variable inductors having 4 or more layers as an integrated variable inductor in accordance with other embodiment of the present invention.
Figure 12:
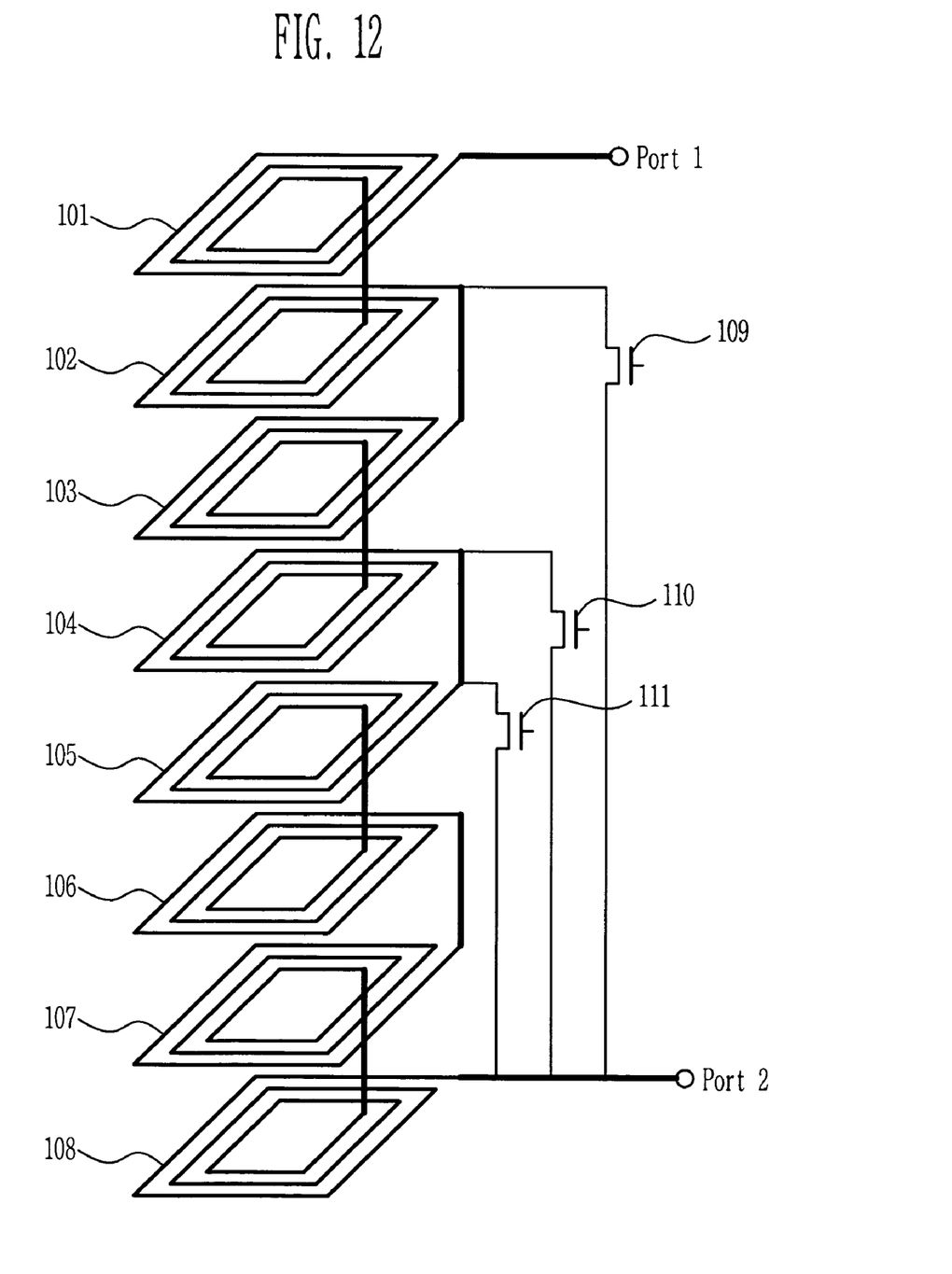

Referring to FIG. 10, switching elements 45 and 46 of the stacked variable inductor of the present invention are formed in serial. For example, inductors 41, 43, and 44 are formed by metal layers each on sixth, fourth, and second layers, and a first switching element 45 is connected between a terminal 42 and a connection terminal between the inductor L2 and inductor L3, and a second switching element 46 is connected between a port 2 and a connection terminal between the inductor L2 and inductor L3.

Meanwhile, each turn of at least two of inductors L1, L2, and L3 can be made with a different configuration. Therefore, turns of FIG. 9A to 9D can also be applied to the eighth embodiment.

When the number of metal layers to be used is increased to 6, 7, 8 layers, etc, the resonance frequency of a stacked inductor is also increased, so that the present embodiment can be applied in wider range. Therefore, it is possible to design the inductor having higher impedance than that of a switch in an operation frequency by changing the number of turns of the inductor.

In addition, when the stacked inductor having equal to or above 3 layers is used, the resonance frequency $f_{res}$ is not more than 2 GHz, it is preferable to make total turns of the inductor not more than 14 to operate the inductor in a frequency not less than 2 GHz. However, when the stacked inductor having equal to or above 6 metal layers is used, reduced parasitic inductance enables the resonance frequency $f_{res}$ to increase, so that the inductor having much more turns can be used Meanwhile, such variable and programmable stacked inductor can be applied to all essential blocks such as an amplifier, mixer, drive amplifier, and power amplifier, etc, so that the applicable range for the inductor is wide. And, complicated RF transmitting/receiving blocks for double band/multi band can be processed by single block, so that the inductor can be readily implemented with small chip area.

In view of the above-mentioned configuration, the present invention varies inductance by using switches and stacked inductors, and when it is applied to a matching circuit, the chip area of the RF IC for double band or multi band can be significantly reduced. As the matching circuit is different in accordance with each frequency band, the RF IC circuit for double or multi band requires a chip area two or three times as large as a single band chip does.

In addition, as single matching circuit designed based on control signals of the switch can be applied to the double band or multi band, programmable or re-configurable RF IC can be designed.

Furthermore, when the above-mentioned stacked variable inductor is applied to a voltage controlled oscillator, a signal source having not less than double band can be created from one circuit.

Although the present invention has been described in conjunction with the preferred embodiment, the present invention is not limited to the embodiments, and it will be apparent to those skilled in the art that the present invention can be modified in variation within the scope of the invention.

What is claimed is:

1. Stacked variable inductors manufactured by stacking M (M≧2) metal layers on a semiconductor substrate using CMOS technology, comprising:

1 to N inductors continuously connected in serial, wherein each of said inductors is formed on N (N≦M) metal layers that are different from each other;

first and second ports connected to the highest inductor and to the lowest inductor, respectively among said 1 to N inductors; and at least one MOSFET, wherein one terminal of said at least one MOSFET is connected to one of said first and second ports, and the other one terminal is connected to one of adjacent terminals connected in serial between said 1 to N inductors.

2. The stacked variable inductors as claimed in claim 1, wherein said N is equal to or above 2 and below 4.

3. The stacked variable inductors as claimed in claim 1, wherein turns of at least two of said 1 to N inductors are made different each other.

4. The stacked variable inductors as claimed in claim 1, wherein total inductance of said 1 to N inductors serially connected through ON/OFF of said MOSFET can be made to vary.

5. The stacked variable inductors as claimed in claim 1, wherein each of turns of said 1 to N inductors gradually decreases or increases from the lower position of the substrate to the upper position.

6. The stacked variable inductors as claimed in claim 1, wherein said M is not less than 3 and said N is 3, and said MOSFET consists of first MOSFET and second MOSFET,
one terminal of said first MOSFET being connected to one of said ports, the other terminal being connected to a serially connected terminal between said first and second inductors,
one terminal of said second MOSFET being connected to said port to which said first MOSFET is connected, and the other terminal being connected to a serially connected terminal between said second and third inductors.

7. The stacked variable inductors as claimed in claim 1, wherein said M is not less than 3 and said N is 3, and said MOSFET consists of first MOSFET and second MOSFET,
one terminal of said first MOSFET being connected to one of said ports, the other terminal being connected to a serially connected terminal between said first and second inductors,
one terminal of said second MOSFET being connected to a serially connected terminal between said first and second inductors, the other terminal being connected to a serially connected terminal between said second and third inductors.

8. The stacked variable inductors as claimed in claim 1, wherein a signal for multi band including at least two bands among 900 MHz, 1.5 GHz, 1.9 GHz, 2.4 GHz, and 5.2 GHz is input to said stacked variable inductors.

9. The stacked variable inductors as claimed in claim 1, wherein said stacked variable inductors operate in an operation frequency not less than 2 GHz.

* * * * *